United States Patent [19]
Yamamoto et al.

[11] Patent Number: 5,831,328
[45] Date of Patent: Nov. 3, 1998

[54] SEMICONDUCTOR DEVICE AND MANUFACTURING METHOD OF THE DEVICE

[75] Inventors: Fumitoshi Yamamoto; Atsushi Tominaga, both of Itami, Japan

[73] Assignee: Mitsubishi Denki Kabushiki Kaisha, Tokyo, Japan

[21] Appl. No.: 890,683

[22] Filed: Jul. 9, 1997

Related U.S. Application Data

[63] Continuation of Ser. No. 491,327, Jun. 30, 1995, abandoned.

[30] Foreign Application Priority Data

Feb. 7, 1995 [JP] Japan ................................. 7-019213

[51] Int. Cl.⁶ ...................... H01L 27/082; H01L 27/102; H01L 29/70; H01L 31/11
[52] U.S. Cl. ........................ 257/575; 257/588; 257/755
[58] Field of Search .................. 257/575, 588, 257/755

[56] References Cited

U.S. PATENT DOCUMENTS

| | | | |
|---|---|---|---|
| 4,140,922 | 2/1979 | Mueller | 257/575 |
| 4,980,304 | 12/1990 | Chin et al. | 257/588 |
| 5,241,203 | 8/1993 | Hsu et al. | 257/382 |
| 5,296,729 | 3/1994 | Yamanaka et al. | 257/382 |

*Primary Examiner*—Stephen Meier
*Attorney, Agent, or Firm*—McDermott, Will & Emery

[57] ABSTRACT

A semiconductor device in which at least one IIL transistor is formed, the semiconductor device having, a base region (6) provided against a semiconductor substrate (1), a plurality of collector regions (9) formed in the base region (6), each of the collector regions (9) aligning in a direction parallel to a spreading surface of the semiconductor substrate (1), and a metal wiring having a plurality of contact portions (10), each of the contact portions being connected electrically to predetermined one of the collector regions (9), characterized in that, each of the contact portions of the metal wiring (10) is connected electrically to the collector region (9) corresponding thereto via a polysilicon cap (11) formed so as to cover the collector region (9).

33 Claims, 7 Drawing Sheets

SEMICONDUCTOR DEVICE AND MANUFACTURING METHOD OF THE DEVICE

This application is a continuation of application Ser. No. 08/491,327 filed Jun. 30, 1995 now Abandoned.

BACKGROUND OF THE INVENTION

1. Field of the Invention

The present invention relates to a semiconductor device in which at least one IIL (Integrated Injection Logic) transistor is formed, and a manufacturing method of the semiconductor device.

2. Description of the Related Art

An IIL transistor ($I^2L$ transistor) which is one of bipolar type semiconductor devices has become of major interest lately, since the IIL transistor enables its integration density to be increased, also its power loss to be reduced, and moreover its acting rate to be elevated.

FIG. 7 is a vertical sectional view that shows an example of a semiconductor device in which a conventional IIL transistor is formed.

As shown in FIG. 7, in the conventional semiconductor device with the IIL transistor, there are provided a p-type silicon substrate (semiconductor substrate) 1, a n-type diffusion layer 2 formed by diffusing antimony etc. into a part of the silicon substrate 1, and an epitaxial layer 3 formed on surfaces of the silicon substrate 1 and the n-type diffusion layer 2 by deposition process. Also in the semiconductor device, there are provided an oxide film 4 formed by means of Locos oxidation, an element separating p-type diffusion layer 5 formed in the epitaxial layer 3, and a p-type diffusion layer 6 acting as a base region or an injector region of the IIL transistor. Moreover in the semiconductor device, there are provided an oxide layer 7 formed on the top surface of the semiconductor device by deposition process, contact holes 8 formed in the oxide layer 7, and n-type diffusion layers 9, each of the layers 9 acting as a collector region or an emitter region of the IIL transistor. Further in the semiconductor device, there is provided an aluminum wiring 10 which includes contact portions located in the contact holes 8, the lower end of each of the contact portions being connected electrically to the n-type diffusion layer 9 corresponding thereto.

Hereat n-type diffusion layers are formed by means of injection of antimony or arsenic etc.. On the other hand p-type diffusion layers are formed by means of injection of boron etc.

The semiconductor device with the IIL transistor shown in FIG. 7 is manufactured conventionally, for example, according to a manufacturing process or a manufacturing procedure shown in FIGS. 8A to 8D.

Namely in the conventional manufacturing process of the semiconductor device with the IIL transistor, as shown in FIG. 8A, at first a silicon oxide film (not shown) having a thickness of 500 to 1000 is formed on a surface of the p-type silicon substrate 1, and then the silicon oxide film is etched by means of photoengraving technique so that a part of the silicon substrate 1 is exposed to the outside. Next, antimony known as typical one of n-type impurities is injected into the exposed part of the silicon substrate 1, and then the silicon substrate 1 is subjected to a heat treatment of 1180° C. so that the epitaxial layer 3 having a thickness equal or more than 3 μm is formed on surfaces of the p-type silicon substrate 1 and the n-type diffusion layer 2 by deposition process.

Next, as shown in FIG. 8B, the silicon oxide film 4 having a thickness of 8000 to 20000 is formed on a surface of the epitaxial layer 3 by means of Locos oxidation. Further boron known as typical one of p-type impurities is injected into a predetermined part of the epitaxial layer 3 by means of photoengraving technique in order to perform an element separation structure, and then the silicon substrate 1 is subjected to a heat treatment of 1100° C. so that the element separating p-type diffusion layer 5 is formed in the epitaxial layer 3. Moreover boron (p-type impurity) is injected into a predetermined part of the region separated by the layer 5 in the epitaxial layer 3 by means of photoengraving technique in order to form a base region and an injector region of the IIL transistor, and then the p-type diffusion layer 6 is formed in the epitaxial layer 3.

Further, as shown in FIG. 8C, the silicon oxide layer 7 is formed on a surface of the silicon substrate 1 to which the above-mentioned processings are performed, by deposition process, and then the silicon oxide layer 7 is etched by means of photoengraving technique so that the contact holes 8 are formed. Next arsenic (n-type impurity) is injected into predetermined parts of the p-type diffusion layer 6 and the epitaxial layer 3 by means of photoengraving technique in order to perform collector regions and an emitter region of the IIL transistor respectively, and then the silicon substrate 1 is subjected to a heat treatment of 1050° C. so that the n-type diffusion layers 9 are formed.

Then, as shown in FIG. 8D, an AlSi layer having a thickness of 5000 to 10000 is formed on a surface of the silicon substrate 1 to which the above-mentioned processings are performed, by sputter etching process, and then the aluminum wiring 10 having the contact portions is formed by means of photoengraving technique.

However in the conventional semiconductor device with the IIL transistor manufactured by means of the above-mentioned manufacturing method, there is such a problem that when another aluminum wiring must be located between two collector regions adjacent each other in a plane direction, it is necessary to enlarge an interval between both the collector regions, namely the distance $d_2$ shown in FIG. 8D considerably. For example, if it is desired that another aluminum wiring is located within a space $A_2$ shown in FIG. 8D, since the space $A_2$ is very narrow, it is very difficult to locate the aluminum wiring there. Therefore, if it is desired that another aluminum wiring is located within the space $A_2$, it is necessary to enlarge the interval $d_2$ between both the collector regions 9 so as to extend the space $A_2$.

On the other hand, in the semiconductor device with the IIL transistor, as the interval between collector regions is increased, the ratio of a collector region area Sc to a base region area Sb, i.e. Sc/Sb is decreased so that a current amplification factor βeff of the IIL transistor is reduced. In the conventional semiconductor device with the IIL transistor, therefore, there is such a problem that when another aluminum wiring is located within the space $A_2$, the current amplification factor βeff is reduced so that the ability of the IIL transistor is decreased.

However, if the interval between the collector regions is not enlarged, a new aluminum wiring can not be located on the plane on which the aluminum wiring 10 has been located already so that the aluminum wiring must be located by means of multi-layer structure (two-layer structure). In this case, however, there is such a problem that manufacturing steps are increased so that manufacturing cost of the semiconductor device is elevated.

SUMMARY OF THE INVENTION

The present invention has been developed to solve the above-mentioned conventional problems, and has an object of providing a semiconductor device with an IIL transistor (or IIL transistors) having a high current amplification factor βeff of the IIL transistor and having a simple and compact wiring structure. Further it has a further object of providing a manufacturing method with less steps which can manufacture the above-mentioned semiconductor device easily.

In order to achieve the above-mentioned object, according to a first aspect of the present invention, there is provided a semiconductor device in which at least one IIL transistor is formed, the semiconductor device comprising, a base region provided against a semiconductor substrate, a plurality of collector regions formed in the base region, each of the collector regions aligning in a direction parallel to a spreading surface of the semiconductor substrate, and a metal wiring having a plurality of contact portions, each of the contact portions being connected electrically to predetermined one of the collector regions, characterized in that, each of the contact portions is connected electrically to the collector region corresponding thereto via a polysilicon cap formed so as to cover the collector region.

According to a second aspect of the present invention, there is provided a semiconductor device, wherein in the first aspect of the present invention, a dimension of each of the contact portions is smaller than that of the collector region corresponding thereto in a direction of alignment of the collector regions.

According to a third aspect of the present invention, there is provided a semiconductor device, wherein in the first or second aspect of the present invention, the base region is comprised of a p-type diffusion layer, each of the collector regions is comprised of a n-type diffusion layer, and each of the polysilicon caps is comprised of a n-type polysilicon.

According to a fourth aspect of the present invention, there is provided a semiconductor device, wherein in any one of the first to third aspects of the present invention, at least one of the polysilicon caps extends out of a gate of the IIL transistor so that the extending part of the polysilicon cap is connected electrically to one of the contact portions of the metal wiring.

According to a fifth aspect of the present invention, there is provided a semiconductor device, wherein in any one of the first to fourth aspects of the present invention, at least one of the polysilicon caps is utilized as a logic circuit wiring of the IIL transistor.

According to a sixth aspect of the present invention, there is provided a semiconductor device, wherein in any one of the first to fifth aspects of the present invention, a silicide film formed by sputter etching is provided on a surface of each of the polysilicon caps.

According to a seventh aspect of the present invention, there is provided a manufacturing method of a semiconductor device in which at least one IIL transistor is formed, the method comprising the steps of, forming a n-type diffusion layer on a semiconductor substrate, forming an epitaxial layer on the semiconductor substrate including the n-type diffusion layer by deposition process, forming an element separating p-type diffusion layer in the epitaxial layer, forming a p-type diffusion layer in the epitaxial layer, acting as a base region of the IIL transistor, forming a plurality of n-type diffusion layers in the p-type diffusion layer, each of the n-type diffusion layers aligning in a direction parallel to a spreading surface of the semiconductor substrate and acting as a collector region of the IIL transistor respectively, forming a plurality of n-type polysilicon caps, each of the polysilicon caps covering predetermined one of the n-type diffusion layers thus to be connected electrically to the n-type diffusion layer respectively, and forming a metal wiring having a plurality of contact portions, each of the contact portions being connected electrically to predetermined one of the n-type polysilicon caps.

According to a eighth aspect of the present invention, there is provided a manufacturing method of a semiconductor device, wherein in the seventh aspect of the present invention, the method further comprising the step of forming a silicide film on a surface of each of the n-type polysilicon caps by sputter etching, wherein the step is performed immediately after the step of forming the n-type polysilicon caps.

According to the present invention, there are achieved such remarkable operations and effects as follows.

Namely, according to the first aspect of the present invention, since each of the contact portions is connected electrically to the collector region corresponding thereto via a polysilicon cap formed so as to cover the collector region, there is no necessity for forming a dimension of the contact portion or the contact hole for the collector region to be equal to that of the collector region corresponding thereto with regard to the direction of alignment of the collector regions so that the dimension of the contact portion or the contact hole can be smaller than that of the collector region. Then a metal wiring can be located within a space between the collector regions with regard to the plane direction, without enlarging of the interval between the collector regions. Therefore, the ratio of a collector region area Sc to a base region area Sb, i.e. Sc/Sb can be increased. Thus the current amplification factor βeff of the IIL transistor can be elevated so that the ability of the IIL transistor can be improved. Further, since it is not necessary that the metal wirings are formed by means of multi-layer structure, the metal wirings can be simplified. Then manufacturing steps for manufacturing the semiconductor device can be decreased so that the manufacturing cost of the semiconductor device can be reduced.

According to the second aspect of the present invention, since each of the contact portions is connected electrically to the collector region corresponding thereto via a polysilicon cap formed so as to cover the collector region and further the dimension of each of the contact portions is smaller than that of the collector region corresponding thereto in a direction of alignment of the collector regions, a metal wiring can be located within a space between the collector regions with regard to the plane direction, without enlarging of the interval between the collector regions. Therefore, the ratio of a collector region area Sc to a base region area Sb, i.e. Sc/Sb can be increased. Thus the current amplification factor βeff of the IIL transistor can be elevated so that the ability of the IIL transistor can be improved. Further, since it is not necessary that the metal wirings are formed by means of multi-layer structure, the metal wirings can be simplified. Then manufacturing steps for manufacturing the semiconductor device can be decreased so that the manufacturing cost of the semiconductor device can be reduced.

According to the third aspect of the present invention, fundamentally, the same operations and effects as in the first or second aspect of the present invention are achieved. Further, since the base region is comprised of a p-type diffusion layer, each of the collector regions is comprised of a n-type diffusion layer, and each of the polysilicon caps is comprised of a n-type polysilicon, the semiconductor device with the IIL transistor having a longitudinal npn-type transistor and a lateral pnp-type transistor gets the above-mentioned operations and effects.

According to the fourth aspect of the present invention, fundamentally, the same operations and effects as in any one of the first to third aspects of the present invention are achieved. Further, since at least one of the polysilicon caps extends out of a gate of the IIL transistor so that the extending portion of the polysilicon cap is connected electrically to one of the contact portions of the metal wiring, the number of metal wirings which can be located the space between the collector regions so that the metal wiring structure is further simplified.

According to the fifth aspect of the present invention, fundamentally, the same operations and effects as in any one of the first to fourth aspects of the present invention are achieved. Further, since at least one of the polysilicon caps is utilized as a logic circuit wiring of the IIL transistor, the area of the logic circuit can be decreased so that the semiconductor device can be moreover simplified.

According to the sixth aspect of the present invention, fundamentally, the same operations and effects as in any one of the first to fifth aspects of the present invention are achieved. Further, since a silicide film formed by sputter etching is provided on a surface of each of the polysilicon caps, the sheet resistance value of the polysilicon caps is remarkably decreased so that the ability of the semiconductor device is improved. Moreover, since the polysilicon caps are not etched on the occasion of forming the contact holes, the shape of the polysilicon caps are improved.

According to the seventh aspect of the present invention, since each of the contact portions is connected electrically to the collector region corresponding thereto via a polysilicon cap formed so as to cover the collector region, there is no necessity for forming a dimension of the contact portion or the contact hole for the collector region to be equal to that of the collector region corresponding thereto with regard to the direction of alignment of the collector regions so that the dimension of the contact portion or the contact hole can be smaller than that of the collector region. Then a metal wiring can be located within a space between the collector regions with regard to the plane direction, without enlarging of the interval between the collector regions. Therefore, the ratio of a collector region area Sc to a base region area Sb, i.e. Sc/Sb can be increased. Thus the current amplification factor $\beta$eff of the IIL transistor can be elevated so that the ability of the IIL transistor can be improved. Further, since it is not necessary that the metal wirings are formed by means of multi-layer structure, the metal wirings can be simplified. Then manufacturing steps for manufacturing the semiconductor device can be decreased so that the manufacturing cost of the semiconductor device can be reduced.

According to the eighth aspect of the present invention, fundamentally, the same operations and effects as in the seventh aspect of the present invention are achieved. Further, since a silicide film is formed on a surface of each of the n-type polysilicon caps by sputter etching immediately after forming of n-type polysilicon caps, the sheet resistance value of the polysilicon caps is remarkably decreased so that the ability of the semiconductor device is improved. Moreover, since the polysilicon caps are not etched on the occasion of forming the contact holes, the shape of the polysilicon caps are improved.

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which.

DETAILED DESCRIPTION OF THE PREFERRED EMBODIMENTS

Figure 1A:
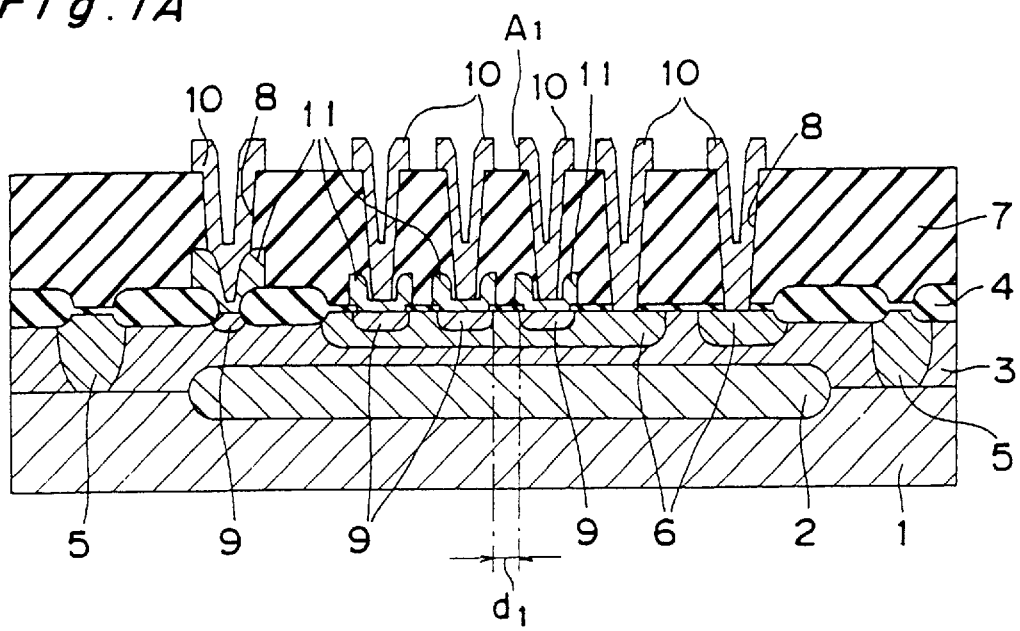
FIGS. 1A and 1B are a vertical sectional view and a plane view of a semiconductor device with an IIL transistor according to the first embodiment of the present invention respectively.

Hereinafter, several preferred embodiments of the present invention will be concretely described with reference to the accompanying drawings. However the duplicate description for the conventional semiconductor device or its manufacturing method as shown in FIG. 7 or 8 is omitted to avoid making a useless description, and then different matters from the conventional art will be described mainly. Thus in FIGS. 1 to 6 which show the embodiments of the present invention, the duplicate members for the conventional semiconductor device shown in FIG. 7 or 8 have the same reference numerals as that of the conventional semiconductor device.

<Embodiment 1>

Figure 1B:
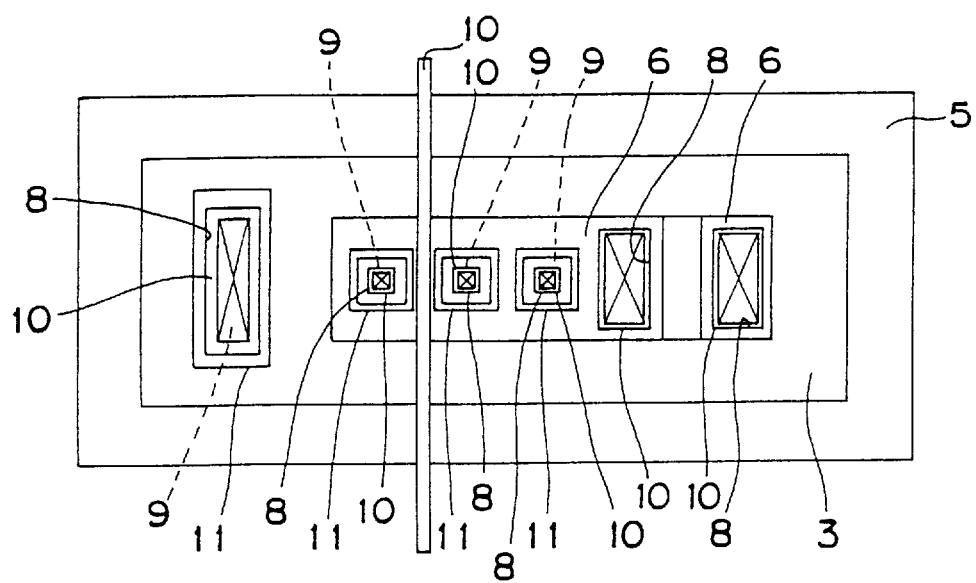

FIGS. 1A and 1B show the first embodiment of the present invention. As shown in FIGS. 1A and 1B, in the semiconductor device according to the first embodiment, there are provided polysilicon caps 11 comprised of n-type polysilicon. Hereat each of the polysilicon caps 11 is formed so as to cover (or cap) the n-type diffusion layer 9 corresponding thereto, which acts as a collector region or an emitter region of the IIL transistor. Then the lower end of each of the polysilicon caps 11 is connected to the almost full upper surface of the n-type diffusion layer 9 corresponding thereto. On the other hand, the upper end of the polysilicon cap 11 is connected to the contact portion of the aluminum wiring 10 corresponding thereto. Hereat each of the polysilicon caps 11 acts as a polysilicon emitter of the npn-type transistor.

And then a dimension of each of the contact holes 8 or the contact portions of the aluminum wiring 10 (the portions located in the contact holes 8) concerned with the collector region is set to be smaller than that of each of the collector regions (n-type diffusion layers 9) as possible as it can, in a direction of alignment of the collector regions.

According to the above-mentioned semiconductor device structure, another aluminum wiring can be located easily within a space $A_1$ between the collector regions with regard to the plane direction, without enlarging of an interval $d_1$ between the collector regions. Therefore, the ratio of a collector region area Sc to a base region area Sb, i.e. Sc/Sb can be increased. Thus the current amplification factor βeff of the IIL transistor can be elevated so that the ability of the IIL transistor can be improved. Further, since it is not necessary that the aluminum wiring 10 are formed by means of multi-layer structure, the aluminum wiring structure can be simplified. Then manufacturing steps for manufacturing the semiconductor device can be decreased so that the manufacturing cost of the semiconductor device can be reduced.

<Embodiment 2>

Figure 2:
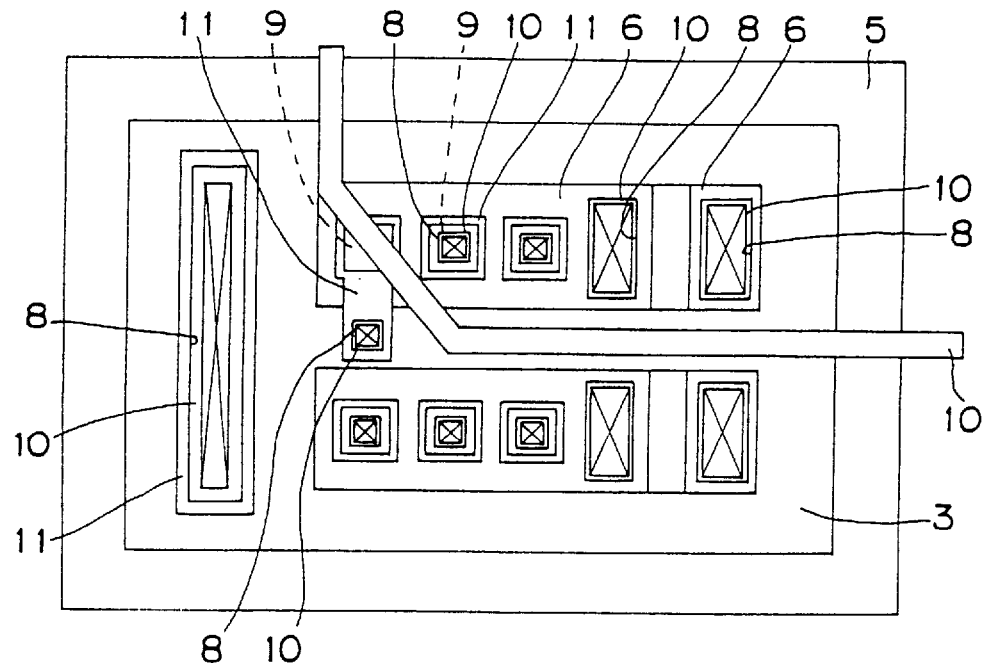
FIG. 2 is a plane view of a semiconductor device with an IIL transistor according to the second embodiment of the present invention.

FIG. 2 shows the second embodiment of the present invention. As shown in FIG. 2, in the second embodiment, one of the polysilicon caps 11 extends out of a gate of the IIL transistor so that the extending portion of the polysilicon cap 11 is connected electrically to the corresponding contact portion of the aluminum wiring 10. Namely, in the first embodiment, the dimension of the contact hole 8 or the contact portion of the aluminum wiring is minimized by providing the n-type polysilicon cap 11 to the collector region of the IIL transistor so that the aluminum wiring structure is simplified. On the other hand, in the second embodiment, the contact structure between the collector region and the aluminum wiring is formed by pulling the n-type polysilicon cap 11 out of the gate so that the aluminum wiring structure is simplified.

According to the above-mentioned semiconductor device, the number of aluminum wirings which can be located within the space between the collector regions becomes larger so that the aluminum wiring structure is further simplified.

<Embodiment 3>

Figure 3:
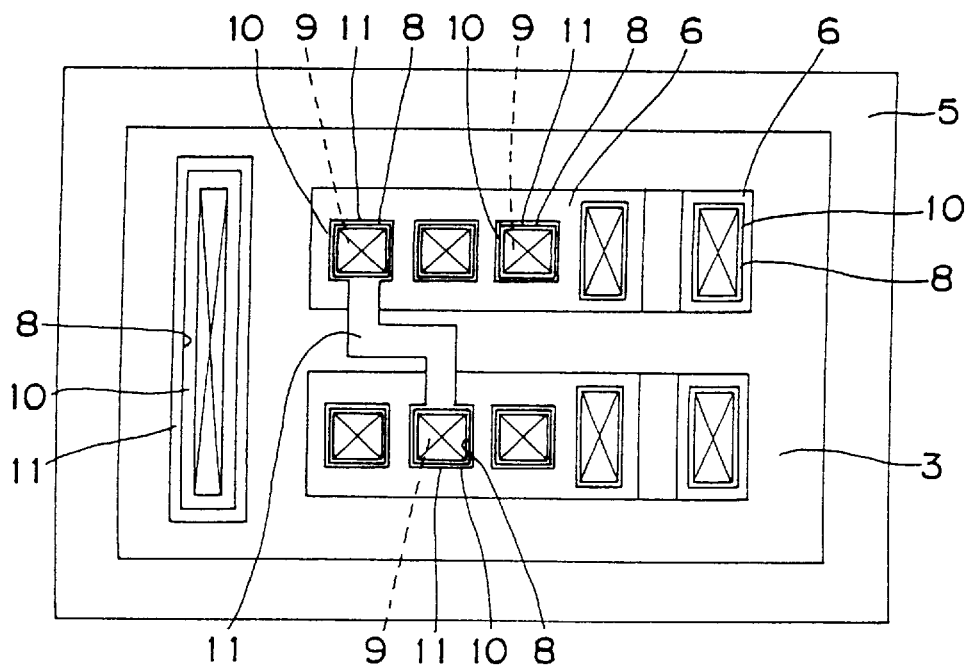
FIG. 3 is a plane view of a semiconductor device with an IIL transistor according to the third embodiment of the present invention.

FIG. 3 shows the third embodiment of the present invention. As shown in FIG. 3, in the third embodiment, one of the polysilicon caps 11 is utilized as a logic circuit wiring of the IIL transistor. Namely, in the second embodiment, the extending portion of the n-type polysilicon cap 11 which extends out of the gate of the IIL transistor is utilized as a contact portion to the aluminum wiring 10 so that the contact hole 8 for the collector is formed in the extending portion. On the other hand, in the third embodiment, the extending portion of the n-type polysilicon cap 11 which extends out of the gate of the IIL transistor is utilized as the logic circuit wiring so that the headmost end of the extending portion is connected to another collector region.

According to the above-mentioned semiconductor device, since one of the n-type polysilicon caps 11 is utilized as the logic circuit wiring of the IIL transistor, the necessity of forming the aluminum wiring 10 to be multi-layer structure is extremely decreased so that the number of steps for manufacturing the semiconductor device is decreased. Further, since the necessary space for locating the aluminum wiring can be reduced by locating the n-type polysilicon caps 11 and the aluminum wiring 10 preferably, the area of the logic circuit of the IIL transistor can be reduced so that the semiconductor device can be moreover simplified.

<Embodiment 4>

Figure 4A:
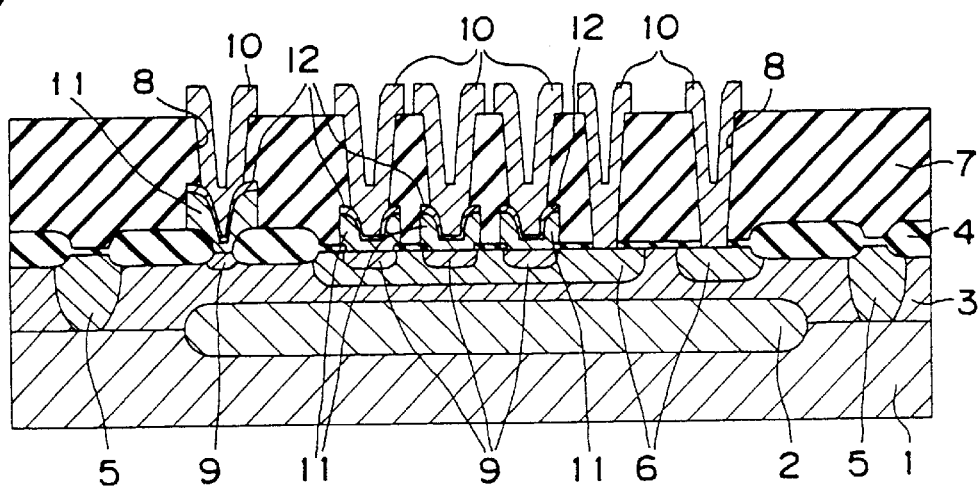
FIGS. 4A and 4B are a vertical sectional view and a plane view of a semiconductor device with an IIL transistor according to the fourth embodiment of the present invention respectively.
Figure 4B:
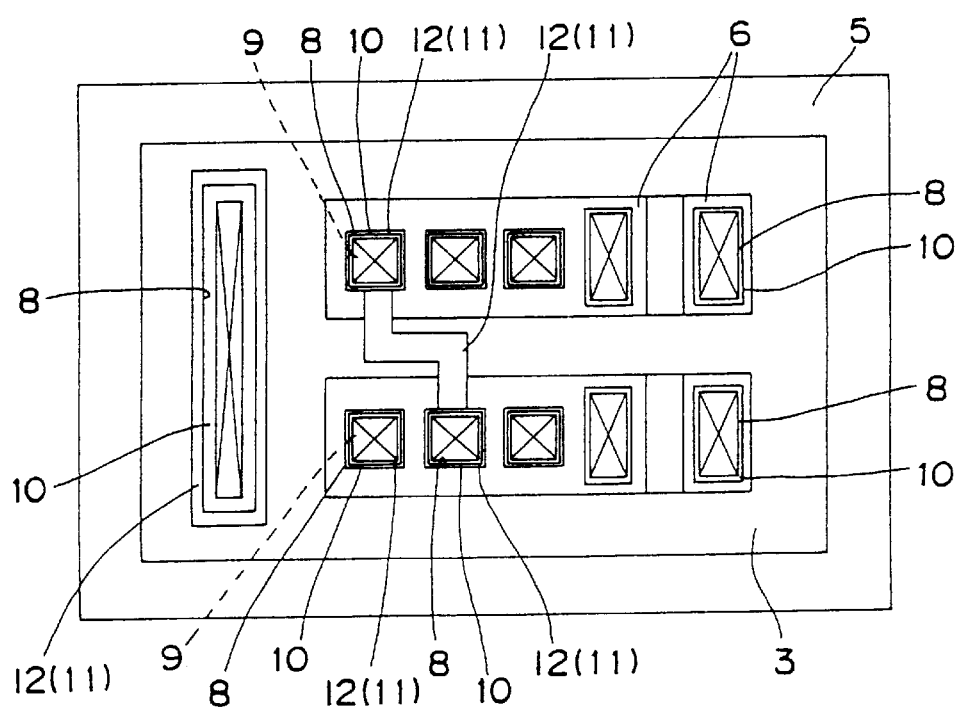

FIGS. 4A and 4B show the fourth embodiment of the present invention. As shown in FIGS. 4A and 4B, a silicide film 12 formed by sputter etching is provided on a surface of each of the polysilicon caps 11.

According to the above-mentioned semiconductor device, the sheet resistance value of the polysilicon caps are remarkably reduced so that the ability of the semiconductor device is improved. Concretely the sheet resistance value of the n-type polysilicon cap 11 which is a part of the wiring is 200 Ω/□ when the silicide film 12 is not provided on the surface of the polysilicon cap 11. On the other hand the sheet resistance is reduced to 5 Ω/□ when the silicide film 12 is provided on the surface of the polysilicon cap 11. Moreover, since the polysilicon caps 11 are not etched on the occasion of forming the contact holes 8, the shape of the polysilicon caps 11 are improved.

<Embodiment 5>

FIGS. 5A to 5D show a manufacturing method of the semiconductor device with the IIL transistor, according to the fifth embodiment of the present invention. In this manufacturing method, the semiconductor device is fundamentally manufactured by means of the process as follows.

Namely at first a n-type diffusion layer 2 is formed on a semiconductor substrate 1, and then an epitaxial layer 3 is formed on the semiconductor substrate 1 including the n-type diffusion layer 2 by deposition process. Next an element separating p-type diffusion layer 5 is formed in the epitaxial layer 3, and then a p-type diffusion layer 6 is formed in the epitaxial layer 3, acting as a base region of the IIL transistor. Further there are formed a plurality of n-type diffusion layers 9 in the p-type diffusion layer 6, each of the n-type diffusion layers 9 aligning in a direction parallel to a spreading surface of the semiconductor substrate 1 and acting as a collector region of the IIL transistor respectively, and then there are formed a plurality of n-type polysilicon caps 11, each of the polysilicon caps 11 covering predetermined one of the n-type diffusion layers 9 thus to be connected electrically to the n-type diffusion layer 9 respectively. And further there is formed an aluminum wiring 10 having a plurality of contact portions, each of the contact portions being connected electrically to predetermined one of the n-type polysilicon caps 11.

Figure 5A:
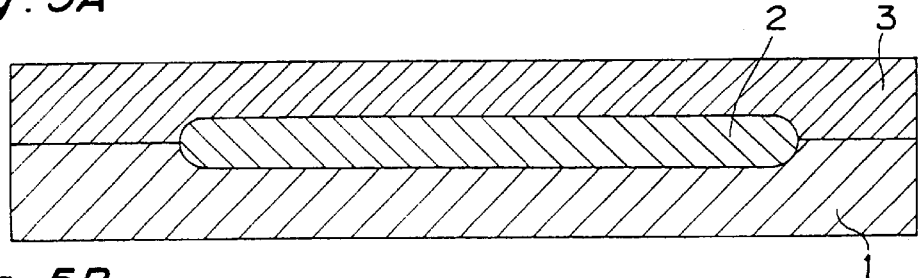
FIGS. 5A, 5B, 5C and 5D are vertical sectional views of a semiconductor device, showing the manufacturing method of the semiconductor device according to the fifth embodiment of the present invention.
Figure 5B:
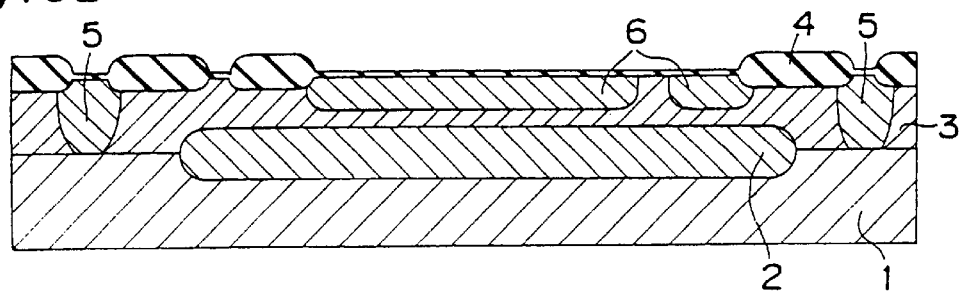
Figure 8A:
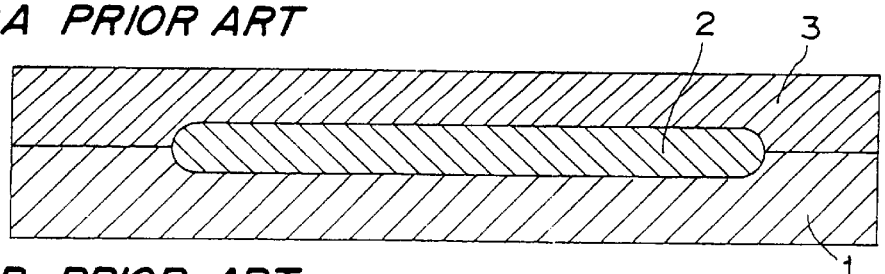
FIGS. 8A, 8B, 8C and 8D are vertical sectional views of the conventional semiconductor device, showing the manufacturing method of the semiconductor device.
Figure 8B:
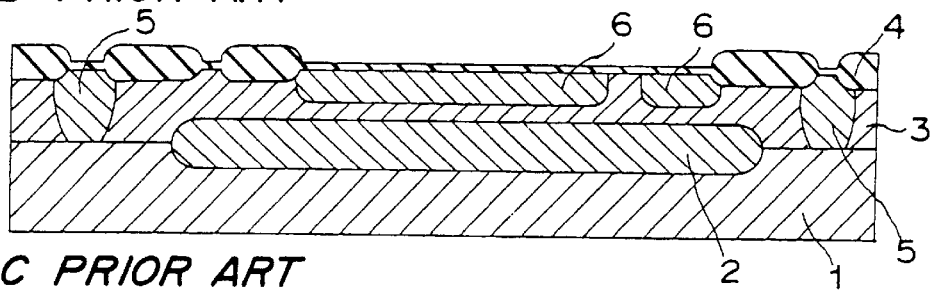
Figure 8C:
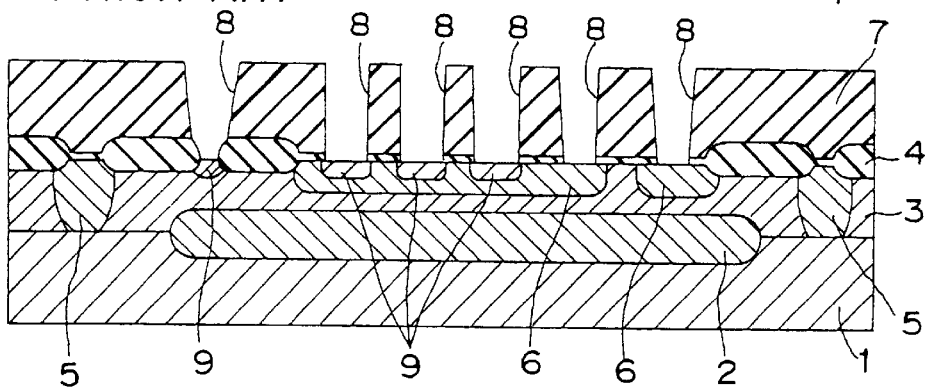
Figure 8D:
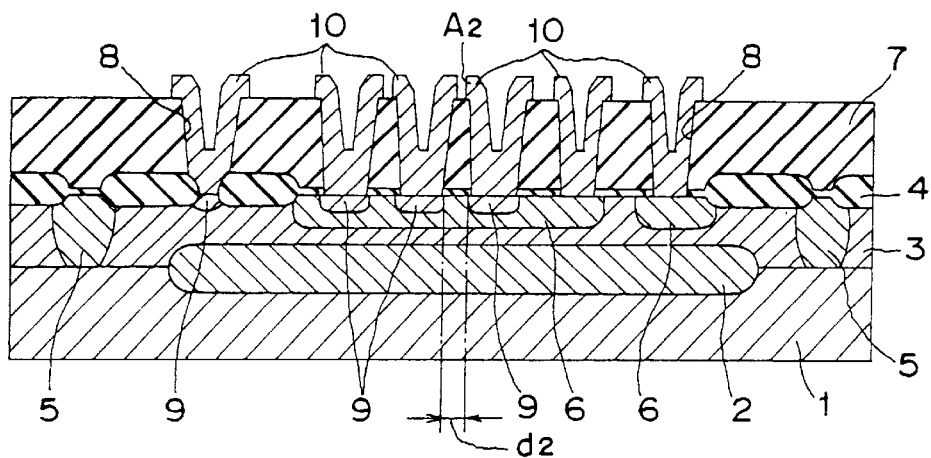

Concretely the manufacturing steps shown in FIGS. 5A and 5B in this process for manufacturing the semiconductor device is as same as the conventional manufacturing steps shown in FIGS. 8A and 8B. However hereinafter the semiconductor device is manufactured by means of the following process different from the conventional manufacturing method.

Figure 5C:
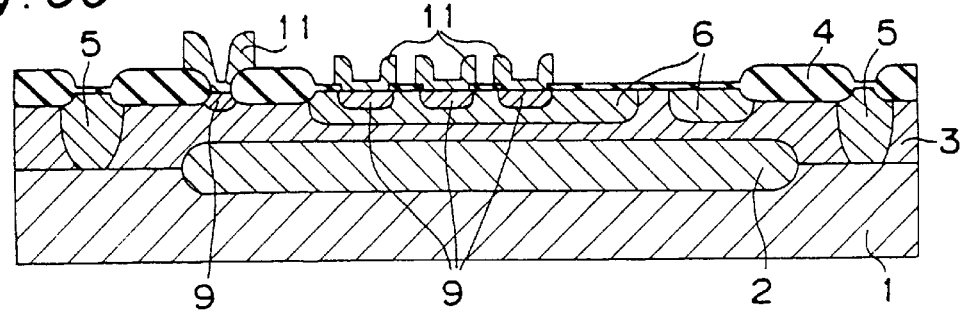

Namely, as shown in FIG. 5C, an oxide film 4 formed on the silicon substrate 1 in which the base region 6 of the IIL transistor is formed (the state shown in FIG. 5B), is etched by means of photoengraving technique. Then arsenic is injected into the etched portion of silicon substrate 1 at a concentration of $3 \times 10^{15}$ to $6 \times 10^{15}/cm^2$ in order to perform collector regions 9 and an emitter region 9 of the IIL transistor. Next polysilicon is deposited on the silicon substrate 1, and then arsenic is injected into the polysilicon at a concentration of $3 \times 10^{15}$ to $6 \times 10^{15}/cm^2$ so that the n-type polysilicon caps 11 are formed.

Figure 5D:
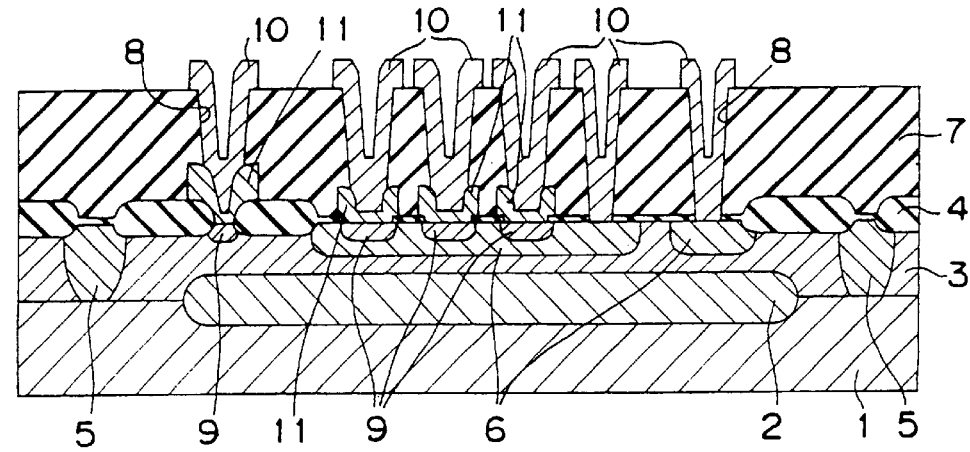

Further a silicon oxide layer 7 is formed on the top surface of the silicon substrate 1 (wafer) by deposition process, then the silicon oxide layer 7 is etched by means of photoengraving technique so that contact holes 8 are formed. Then, as shown in FIG. 5D, an AlSi layer is formed on the surface of the silicon substrate 1 by sputter etching process, and then the aluminum wiring 10 including the contact portions is formed by means of photoengraving technique. Thus the semiconductor device with the IIL transistor is completed.

According to the above-mentioned manufacturing method, there is no necessity for forming a dimension of the contact hole 8 for the collector region or the contact portion of the aluminum wiring 10 to be equal to that of the collector region corresponding thereto with regard to the direction of alignment of the collector regions so that the dimension of the contact portion or the contact hole can be smaller than that of the collector region. Therefore another aluminum wiring can be located moreover within a space between the collector regions with regard to the plane direction, without enlarging of an interval between the collector regions. Thus, the ratio of a collector region area Sc to a base region area Sb, i.e. Sc/Sb can be increased. Then the current amplification factor βeff of the IIL transistor can be elevated so that the ability of the IIL transistor can be improved. Further, since it is not necessary that the aluminum wiring 10 are formed by means of multi-layer structure, the aluminum wiring can be simplified. Therefore manufacturing steps for manufacturing the semiconductor device can be decreased so that the manufacturing cost of the semiconductor device can be reduced.

<Embodiment 6>

FIGS. 6A to 6D show a manufacturing method of a semiconductor device with an IIL transistor, according to the sixth embodiment of the present invention. In the manufacturing method according to the sixth embodiment, a step of forming a silicide film 12 on a surface of each of the n-type polysilicon caps 11 by sputter etching, is added immediately after the step of forming the n-type polysilicon caps 11 in the manufacturing method of the semiconductor device according to the fifth embodiment.

Concretely the semiconductor device with the IIL transistor is manufactured according to the following process.

Figure 6A:
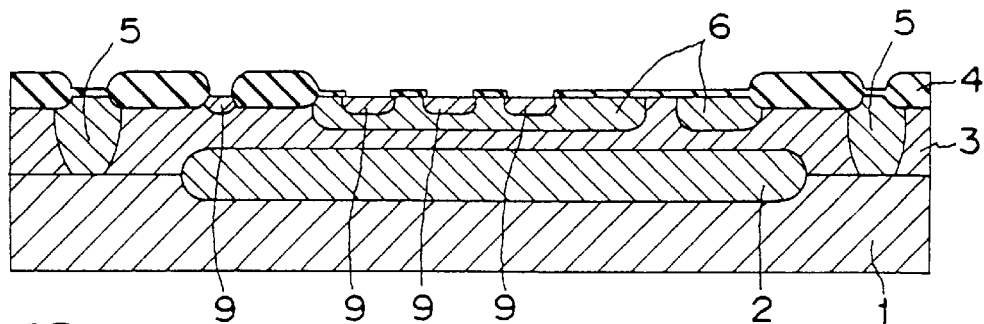
FIGS. 6A, 6B, 6C and 6D are vertical sectional views of a semiconductor device, showing the manufacturing method of the semiconductor device according to the sixth embodiment of the present invention.
Figure 6B:
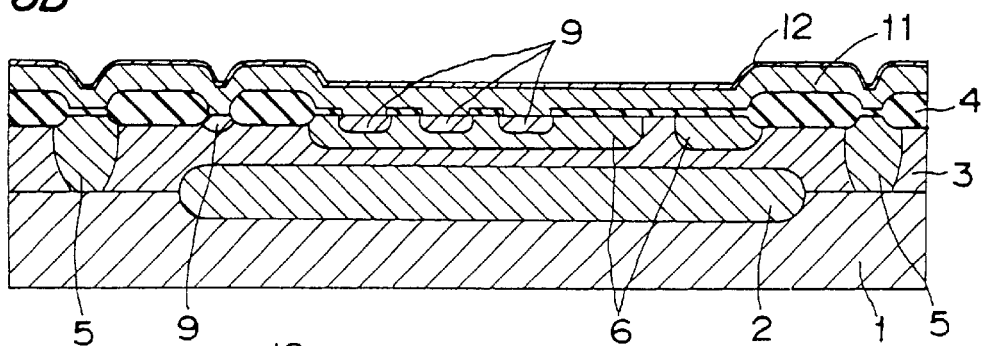
Figure 7:
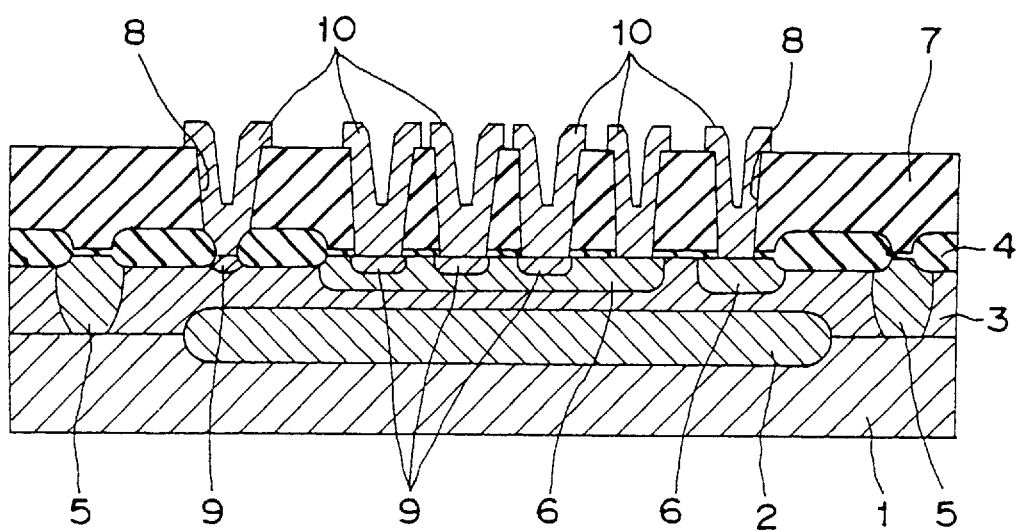
FIG. 7 is a vertical sectional view of a conventional semiconductor device with an IIL transistor.

Namely at first polysilicon is deposited on the top surface of the silicon substrate 1 (wafer) as shown in FIG. 6A, in which the n-type diffusion layers 9 are formed, each of the layers 9 acting as a collector region or an emitter region of the IIL transistor. Then, as shown in FIG. 6B, arsenic is injected into the polysilicon at a concentration of $3\times10^{15}$ to $6\times10^{15}/cm^2$ so that a n-type polysilicon layer 11 are formed. Next the silicide film 12 is formed on the surface of the polysilicon layer 11.

Figure 6C:
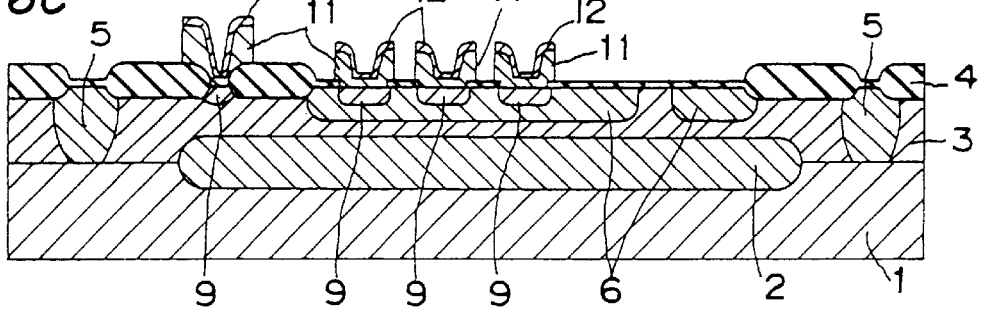
Figure 6D:
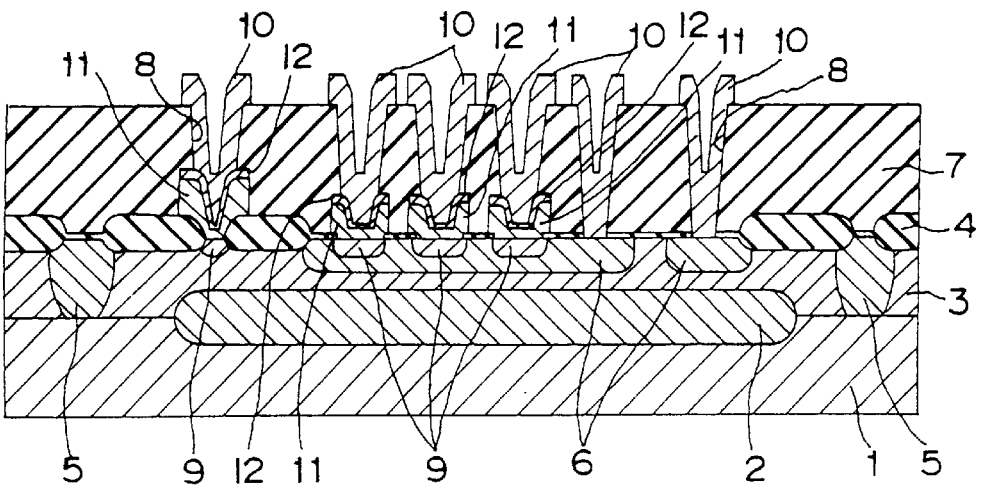

Further, as shown in FIG. 6C, the n-type polysilicon layer 11 having the silicide film 12 is etched by means of photoengraving technique so that polysilicon caps 11 for the collector region or emitter region are formed. Then the silicon substrate 1 is subjected to the treatment as same as that of the fifth embodiment so that the semiconductor device shown in FIG. 6D is completed.

According to the above-mentioned manufacturing method, the sheet resistance value of the polysilicon caps 11 are remarkably decreased so that the ability of the semiconductor device is improved. Moreover, since the polysilicon caps 11 are not etched on the occasion of forming the contact holes 8, the shape of the polysilicon caps 11 are improved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device in which at least one IIL transistor is formed, said semiconductor device comprising:
    a base region provided against a semiconductor substrate;
    a plurality of collector regions, each having an upper surface, formed in said base region, each of said collector regions aligning in a direction parallel to a spreading surface of said semiconductor substrate; and
    a metal wiring having a plurality of sections terminating in contact portions, each of said contact portions being connected electrically to predetermined one of said collector regions, characterized in that;
    each of said contact portions is connected electrically to the collector region corresponding thereto via a polysilicon cap in contact with substantially the full upper surface of said collector region, each metal wiring contact portion being smaller than the contact portion between the polysilicon cap and the collector region to which the metal wiring contact portion is electrically connected.

2. The semiconductor device recited in claim 1, wherein a dimension of each of said contact portions is smaller than that of the collector region corresponding thereto in a direction of alignment of said collector regions.

3. The semiconductor device recited in claim 2, wherein said base region is comprised of a p-type diffusion layer, each of said collector regions is comprised of a n-type diffusion layer, and each of said polysilicon caps is comprised of a n-type polysilicon.

4. The semiconductor device recited in claim 3, wherein at least one of said polysilicon caps extends out of a gate of said IIL transistor so that the extending portion of said polysilicon cap is connected electrically to one of said contact portions of said metal wiring.

5. The semiconductor device recited in claim 4, wherein at least one of said polysilicon caps is utilized as a logic circuit wiring of said IIL transistor.

6. The semiconductor device recited in claim 5, wherein a silicide film formed by sputter etching is provided on a surface of each of said polysilicon caps.

7. The semiconductor device recited in claim 4, wherein a silicide film formed by sputter etching is provided on a surface of each of said polysilicon caps.

8. The semiconductor device recited in claim 3, wherein at least one of said polysilicon caps is utilized as a logic circuit wiring of said IIL transistor.

9. The semiconductor device recited in claim 8, wherein a silicide film formed by sputter etching is provided on a surface of each of said polysilicon caps.

10. The semiconductor device recited in claim 3, wherein a silicide film formed by sputter etching is provided on a surface of each of said polysilicon caps.

11. The semiconductor device recited in claim 2, wherein at least one of said polysilicon caps extends out of a gate of said IIL transistor so that the extending portion of said polysilicon cap is connected electrically to one of said contact portions of said metal wiring.

12. The semiconductor device recited in claim 11, wherein at least one of said polysilicon caps is utilized as a logic circuit wiring of said IIL transistor.

13. The semiconductor device recited in claim 12, wherein a silicide film formed by sputter etching is provided on a surface of each of said polysilicon caps.

14. The semiconductor device recited in claim 11, wherein a silicide film formed by sputter etching is provided on a surface of each of said polysilicon caps.

15. The semiconductor device recited in claim 2, wherein at least one of said polysilicon caps is utilized as a logic circuit wiring of said IIL transistor.

16. The semiconductor device recited in claim 15, wherein a silicide film formed by sputter etching is provided on a surface of each of said polysilicon caps.

17. The semiconductor device recited in claim 2, wherein a silicide film formed by sputter etching is provided on a surface of each of said polysilicon caps.

18. The semiconductor device recited in claim 1, wherein said base region is comprised of a p-type diffusion layer, each of said collector regions is comprised of a n-type diffusion layer, and each of said polysilicon caps is comprised of a n-type polysilicon.

19. The semiconductor device recited in claim 18, wherein at least one of said polysilicon caps extends out of a gate of said IIL transistor so that the extending portion of said polysilicon cap is connected electrically to one of said contact portions of said metal wiring.

20. The semiconductor device recited in claim 19, wherein at least one of said polysilicon caps is utilized as a logic circuit wiring of said IIL transistor.

21. The semiconductor device recited in claim 20, wherein a silicide film formed by sputter etching is provided on a surface of each of said polysilicon caps.

22. The semiconductor device recited in claim 19, wherein a silicide film formed by sputter etching is provided on a surface of each of said polysilicon caps.

23. The semiconductor device recited in claim 18, wherein a silicide film formed by sputter etching is provided on a surface of each of said polysilicon caps.

24. The semiconductor device recited in claim 18, wherein at least one of said polysilicon caps is utilized as a logic circuit wiring of said IIL transistor.

25. The semiconductor device recited in claim 24, wherein a silicide film formed by sputter etching is provided on a surface of each of said polysilicon caps.

26. The semiconductor device recited in claim 1, wherein at least one of said polysilicon caps extends out of a gate of said IIL transistor so that the extending portion of said polysilicon cap is connected electrically to one of said contact portions of said metal wiring.

27. The semiconductor device recited in claim 26, wherein at least one of said polysilicon caps is utilized as a logic circuit wiring of said IIL transistor.

28. The semiconductor device recited in claim 27, wherein a silicide film formed by sputter etching is provided on a surface of each of said polysilicon caps.

29. The semiconductor device recited in claim 26, wherein a silicide film formed by sputter etching is provided on a surface of each of said polysilicon caps.

30. The semiconductor device recited in claim 1, wherein at least one of said polysilicon caps is utilized as a logic circuit wiring of said IIL transistor.

31. The semiconductor device recited in claim 30, wherein a silicide film formed by sputter etching is provided on a surface of each of said polysilicon caps.

32. The semiconductor device recited in claim 1, wherein a silicide film formed by sputter etching is provided on a surface of each of said polysilicon caps.

33. The semiconductor device according to claim 1, wherein each metal wiring section is tapered toward the contact portion.

* * * * *